United States Patent
Watanabe

(10) Patent No.: US 7,595,671 B2
(45) Date of Patent: Sep. 29, 2009

(54) PLL CIRCUIT

(75) Inventor: Masafumi Watanabe, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 62 days.

(21) Appl. No.: 11/898,460

(22) Filed: Sep. 12, 2007

(65) Prior Publication Data
US 2008/0061850 A1 Mar. 13, 2008

(30) Foreign Application Priority Data
Sep. 13, 2006 (JP) ............................ 2006-247522

(51) Int. Cl.
H03L 7/06 (2006.01)
(52) U.S. Cl. ...................................... 327/156; 327/147
(58) Field of Classification Search ................. 327/156, 327/147
See application file for complete search history.

(56) References Cited

U.S. PATENT DOCUMENTS 7,095,287 B2 * 8/2006 Maxim et al. .................. 331/44
7,330,058 B2 * 2/2008 Lin ............................. 327/157

FOREIGN PATENT DOCUMENTS

JP 9-266443 10/1997

* cited by examiner

*Primary Examiner*—Lincoln Donovan
*Assistant Examiner*—Daniel Rojas
(74) *Attorney, Agent, or Firm*—McGinn IP Law Group, PLLC

(57) ABSTRACT

A PLL circuit according to an embodiment of the present invention includes: a phase comparing circuit comparing phases of a reference clock signal and a feedback clock signal to output a voltage-up signal and a voltage-down signal based on the phase difference; a first charge pump circuit generating a first current based on the voltage-up signal and the voltage-down signal; a dummy signal generating circuit outputting a dummy signal having substantially the same pulse width as a pulse width of the voltage-up signal or the voltage-down signal in sync with the voltage-up signal or the voltage-down signal; a second charge pump circuit generating a second current based on the dummy signal; and a voltage-controlled oscillator controlling an output clock frequency based on a differential voltage between a first voltage generated in accordance with the first current and a second voltage generated in accordance with the second current.

12 Claims, 9 Drawing Sheets

PLL CIRCUIT

BACKGROUND OF THE INVENTION

1. Field of the Invention

The present invention relates to a PLL circuit and more particularly to a PLL circuit provided with a charge pump circuit.

2. Description of Related Art

In recent years, PLL (Phase Locked Loop) circuits have been used as an oscillation circuit incorporated into a semiconductor device in many cases. The PLL circuits control an oscillation frequency of an output signal to synchronize a phase of a reference signal with a phase of the output signal.

FIG. 7 is a block diagram of a general PLL circuit. As shown in FIG. 7, a PLL circuit 70 includes a phase comparing circuit (hereinafter referred to as "phase frequency comparator") 71, a charge pump circuit 72, a loop filter 73, and a voltage-controlled oscillator 74.

The phase frequency comparator 71 compares a reference clock signal Fr with a feedback clock signal Fd obtained by feeding back an output clock signal Fout of the PLL circuit 70 and then outputs a voltage-up signal (hereinafter referred to as "UP signal") and a voltage-down signal (hereinafter referred to as "DN signal") for controlling the charge pump circuit 72. The charge pump circuit 72 outputs a current based on a pulse width difference between the UP signal and the DN signal and outputs a charge pump output voltage in accordance with an amount of the output current. This current is supplied in an inflow direction or outflow direction based on the pulse width difference between the UP signal and the DN signal under control. The loop filter 73 generates a voltage in accordance with a current output from the charge pump circuit 72. Further, the loop filter 73 filters out RF noise superimposed on the generated voltage. The voltage-controlled oscillator 74 sends out an output clock signal Fout having a frequency corresponding to a voltage generated through the loop filter 73. In addition, the output clock signal Fout is input to the phase frequency comparator 71 as the feedback clock signal Fd. In the PLL circuit 70 thus configured, the charge pump circuit 72 involves a parasitic capacitance (see FIG. 8). The parasitic capacitance leads to spiked noise in a current output from the charge pump circuit 72. Further, the spiked noise instantly modulates an oscillation frequency of an output clock signal Fout output from the voltage-controlled oscillator 74, which causes jitter. Japanese Unexamined Patent Application Publication No. 9-266443 describes a charge pump circuit to cancel the spiked noise caused by the parasitic capacitance.

FIG. 9 shows the charge pump circuit disclosed in Japanese Unexamined Patent Application Publication No. 9-266443. The charge pump circuit of FIG. 9 includes a main current control unit 91 and an overcurrent cancelling unit 92. In this case, the main current control unit 91 generates a spiked current Ip1 in accordance with a parasitic capacitance of a main current control unit 91 based on an input signal. On the other hand, the overcurrent cancelling unit 92 generates a spiked current Ip2 in opposite phase with the spiked current Ip1 output from the main current control unit 91 based on the same input signal as the signal input to the main current control unit 91. That is, the spiked current Ip1 output from the main current control unit 91 cancels out the spiked current Ip2 output from the overcurrent cancelling unit 92. In this way, spiked noise caused by the parasitic capacitance in the charge pump circuit 72 is cancelled out to thereby reduce jitter of the PLL circuit. In this case, the main current control unit 91 and the overcurrent cancelling unit 92 ideally have the same element characteristics.

However, according to the technique of Japanese Unexamined Patent Application Publication No. 9-266443, the same signal is input to the main current control unit 91 and overcurrent cancelling unit 92, so if the main current control unit 91 and the overcurrent cancelling unit 92 have the same element characteristics, a predetermined current cannot be supplied from the overcurrent cancelling unit 92. That is, the charge pump circuit cannot perform an operation of outputting a current based on an input signal as the original operations, so it is impossible that the main current control unit 91 and the overcurrent cancelling unit 92 have the same element characteristics. Since the element characteristics are not equal as described above, the spiked noise cannot be cancelled out enough. Thus, the jitter of the PLL circuit cannot be reduced well.

As described above, in the charge pump circuit of the related art, spiked noise caused by a parasitic capacitance in the charge pump circuit cannot be cancelled out enough.

SUMMARY

In one embodiment of the present invention, there is provided a PLL circuit that includes a phase comparing circuit comparing a phase of a reference clock signal with a phase of a feedback clock signal to output a voltage-up signal and a voltage-down signal based on a phase difference between the reference clock signal and the feedback clock signal; a first charge pump circuit generating a first current based on the voltage-up signal and the voltage-down signal; a dummy signal generating circuit outputting a dummy signal having substantially the same pulse width as a pulse width of one of the voltage-up signal and the voltage-down signal in sync with the voltage-up signal or the voltage-down signal; a second charge pump circuit generating a second current based on the dummy signal; and a voltage-controlled oscillator controlling an output clock frequency based on a differential voltage between a first voltage generated in accordance with the first current and a second voltage generated in accordance with the second current.

With the PLL circuit of the present invention, spiked noise superimposed on the first voltage cancels out spiked noise superimposed on the second voltage. Hence, the voltage-controlled oscillator can control an output clock frequency in accordance with an input voltage from which spiked noise is removed. Further, since the spiked noise is removed from the input voltage of the voltage-controlled oscillator, jitter of an output clock is reduced.

The PLL circuit according to the present invention can generate a clock involving little jitter.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
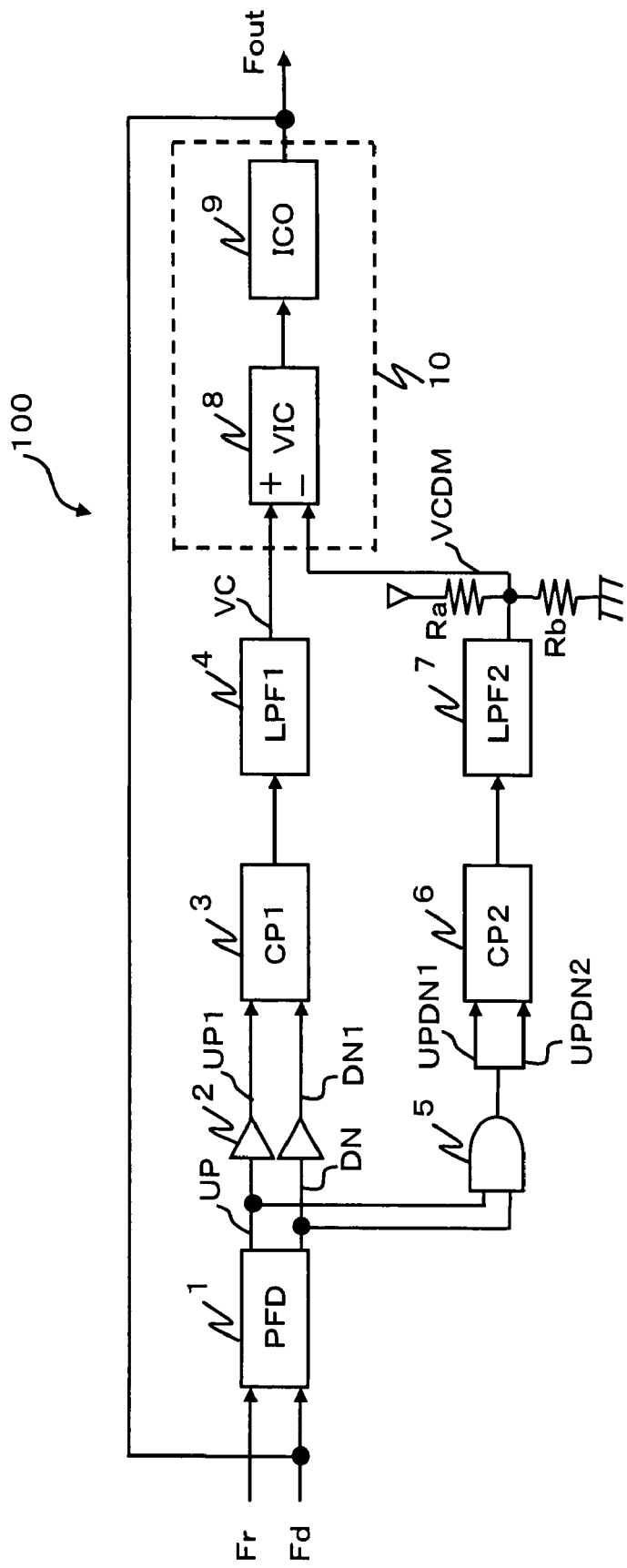
FIG. 1 shows a PLL circuit according to a first embodiment of the present invention.

Hereinafter, embodiments of the present invention will be described in detail with reference to the accompanying drawings. FIG. 1 shows a phase locked loop circuit (hereinafter referred to as "PLL circuit") 100 according to a first embodiment of the present invention. The PLL circuit is intended to control an oscillation frequency of an output signal to synchronize a phase of a reference signal with a phase of the output signal. As shown in FIG. 1, the PLL circuit 100 of this embodiment includes a phase comparing circuit (hereinafter referred to as "phase frequency comparator") 1, a first charge pump circuit 3, a second charge pump circuit 6, a first filter 4, a second filter 7, a voltage-controlled oscillator 10, a buffer circuit 2, and a dummy signal generating circuit 5. Incidentally, in this embodiment, the filter is a loop filter. In addition, the voltage-controlled oscillator 10 includes a voltage-current converting circuit 8 and a current-controlled oscillator 9.

The phase frequency comparator 1 is a circuit to compare phases of two input signals to output a signal corresponding to a phase difference between the input signals. The phase frequency comparator circuit 1 of this embodiment outputs a voltage-up signal (hereinafter referred to as "UP signal") and a voltage-down signal (hereinafter referred to as "DN signal") in accordance with a phase difference between a reference signal Fr and a feedback signal Fd. The UP signal and the DN signal are, for example, pulse signals.

The buffer circuit 2 outputs an UP1 signal and a DN1 signal in response to the input UP signal and DN signal, respectively. In this example, a dummy signal input to the second charge pump circuit 6 is supplied through the dummy signal generating circuit 5, so delay occurs in the dummy signal generating circuit 5. Thus, in this embodiment, a buffer 2 is connected to an input of the first charge pump circuit 3 to cause a delay in a signal input to the first charge pump circuit 3 similar to the delay in the dummy signal generating circuit 5. Incidentally, the dummy signal generating circuit 5 is described in detail later.

The first charge pump circuit 3 controls an output current based on the UP1 signal and the DN1 signal. For example, if a pulse width of the UP1 signal is larger than that of the DN1 signal, a current Icp is allowed to flow out during a period corresponding to the pulse width difference. On the other hand, if a pulse width of the UP1 signal is smaller than that of the DN1 signal, the current Icp is allowed to flow in during a period corresponding to the pulse width difference.

The first loop filter 4 is a circuit mainly configured by integrating circuits and intended to average input discrete signals (current signals) and output an average signal. Further, the first loop filter 4 of this embodiment receives a current output from the first charge pump circuit 3 and outputs a voltage VC.

The dummy signal generating circuit 5 outputs dummy signals ("UPDN signal" in the drawings) based on signals (UP signal and DN signal) output from the phase frequency comparator 1. The dummy signals simulate an UP signal and a DN signal generated in such a state that the reference clock signal Fr and the feedback clock signal Fd are in sync with each other (hereinafter referred to as "locked state"). In this embodiment, the UP signal and the DN signal have the same pulse width in the locked state. Hence, the dummy signals are generated as two signals of the same pulse width. In this embodiment, the dummy signal generating circuit 5 is an AND circuit. Then, the AND circuit 5 calculates the logical product of the UP signal and the DN signal output from the phase frequency comparator 1 to thereby generate dummy signals. The dummy signals are input to the second charge pump circuit 6 as a dummy 1 signal and a dummy 2 signal. Further, the dummy signals are generated on the basis of the logical product of the UP signal and the DN signal and thus synchronized with one of the signals input to the first charge pump circuit 3. Incidentally, the dummy signal generating circuit 5 may be an OR circuit. In this case, the dummy signals are generated based on the logical addition of the UP signal and DN signal output from the phase frequency comparator 1.

The second charge pump circuit 6 controls an output current based on the dummy signals. In this case, the dummy 1 signal and the dummy 2 signal have the same pulse width. Incidentally, the second charge pump circuit 6 has the same circuit configuration as that of the first charge pump circuit 3.

The second loop filter 7 receives a current output from the second charge pump circuit 6 and then outputs a voltage VCDM. Incidentally, in this embodiment, the second loop filter has the same circuit configuration as that of the first loop filter 4. The second loop filter may be added with a common feedback circuit to determine a DC potential (common potential) of the second loop filter. As an example of the simplest circuits, a power supply potential may be connected in the form of resistor having a resistance value much higher than an impedance of the loop filter with the resistance potential being divided. Incidentally, resistors Ra and Rb are series-connected between the power supply potential and the ground potential in the drawings (see FIG. 1).

The voltage-controlled oscillator 10 is composed of the voltage-current converting circuit 8 and the current-controlled oscillator 9. The voltage-current converting circuit 8 outputs a current in accordance with a voltage output from the loop filter. The voltage-current converting circuit 8 of this embodiment receives a voltage VC output from the first loop filter 4 and a voltage VCDM output from the second loop filter 7, and then outputs a current corresponding to a differential voltage between the voltage VC and the voltage VCDM.

The current-controlled oscillator 9 is a circuit to control an oscillation frequency of an output signal in accordance with an amount of the input current. The current-controlled oscillator 9 outputs an output clock signal Fout having a frequency corresponding to a current output from the voltage-current converting circuit 8.

Figure 2:
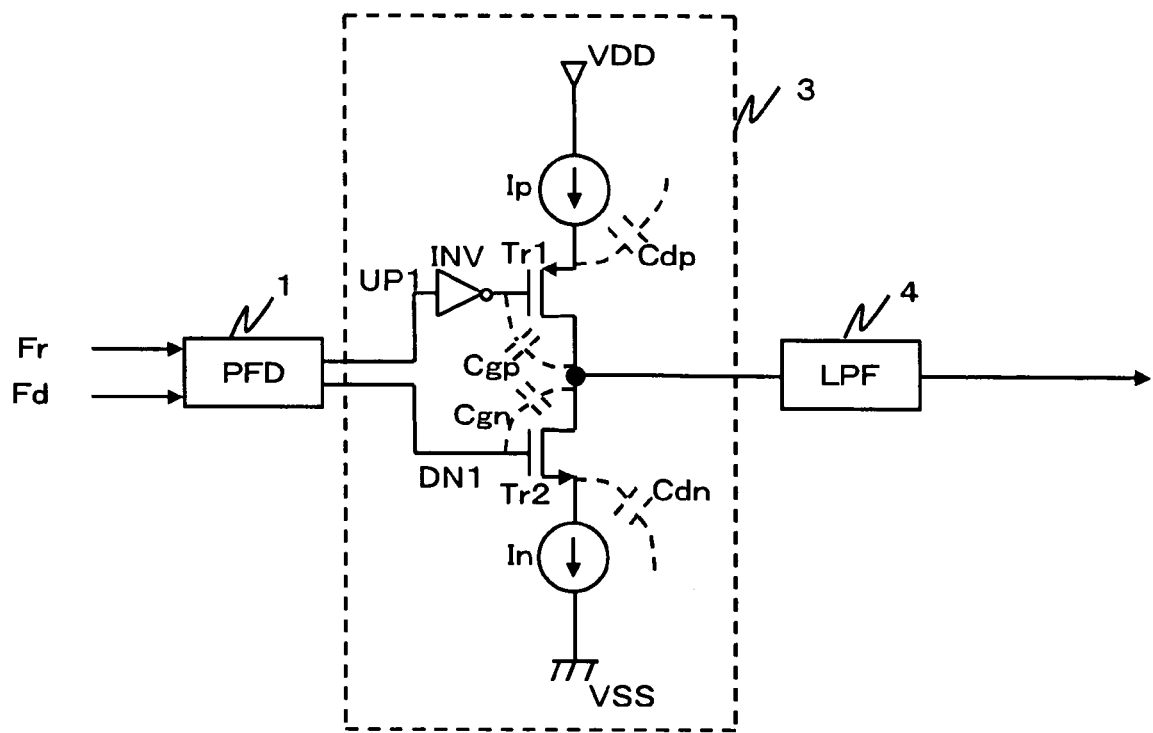
FIG. 2 shows a charge pump circuit in the PLL circuit of the first embodiment.

Here, the charge pump circuit is described with reference to FIG. 2. In this embodiment, the first charge pump circuit 3 and the second charge pump circuit 6 have the same circuit configuration, so description is given of the first charge pump circuit 3 by way of example. The first charge pump circuit 3 includes a first current source Ip, a second current source In, a PMOS transistor Tr1, an NMOS transistor Tr2, and an inverter circuit INV.

The first current source Ip is connected between a power supply voltage terminal VDD and a source of the PMOS transistor Tr1. The second current source In is connected between a ground potential terminal VSS and a source of the NMOS transistor Tr2. A drain of the PMOS transistor Tr1 and a drain of the NMOS transistor Tr2 are connected together, and a node therebetween is an output terminal of the first charge pump circuit 3. Further, a gate of the PMOS transistor Tr1 receives the UP1 signal through the inverter circuit INV. The DN1 signal is input to a gate of the NMOS transistor Tr2.

Moreover, a parasitic capacitance is formed at terminals of the PMOS transistor Tr1 and the NMOS transistor Tr2. For example, a first parasitic capacitance Cgp is formed between the gate and drain of the PMOS transistor Tr1, and a second parasitic capacitance Cdp is formed at the source of the PMOS transistor Tr1. On the other hand, a third parasitic capacitance Cgn is formed between the gate and drain of the NMOS transistor Tr2, and a fourth parasitic capacitance Cdn is formed at the source of the NMOS transistor Tr2. The first charge pump circuit 3 charges/discharges the parasitic capacitance in accordance with a switching operation of the transistor. Since an output current varies due to the above charge/discharge, pulsed noise is superimposed on the output voltage.

Incidentally, a capacitance value of the parasitic capacitance is determined by a shape of the transistor, in particular, an area of a gate region, a source region, and a drain region of the transistor. Then, the pulsed noise level varies depending on a capacitance value of the parasitic capacitance. That is, the first charge pump circuit 3 and the second charge pump circuit 6 employ the PMOS transistor Tr1 and the NMOS transistor Tr2 of the same size, so spiked noise superimposed on the output voltage VC of the charge pump circuit and spiked noise superimposed on the output voltage VCDM thereof are at the same level.

Next, operations of the PLL circuit 100 are described. First of all, a reference clock signal Fr and a feedback clock signal Fd are input to the phase frequency comparator 1. The feedback signal Fd is obtained by feeding back a signal output from the current-controlled oscillator 9. At this time, the phase frequency comparator 1 compares phases of the input reference clock signal Fr and feedback clock signal Fd to generate an UP signal and a DN signal. The UP signal and DN signal output from the phase frequency comparator 1 are input to the first charge pump circuit 3 as an UP1 signal and a DN1 signal, respectively, through the buffer 2. On the other hand, the AND circuit 5 generates dummy signals based on the UP signal and DN signal. Hereinafter, description is made of a signal waveform in the case where a phase of the reference clock signal Fr does not match with that of the feedback clock signal Fd or in a locked state.

Figure 3:
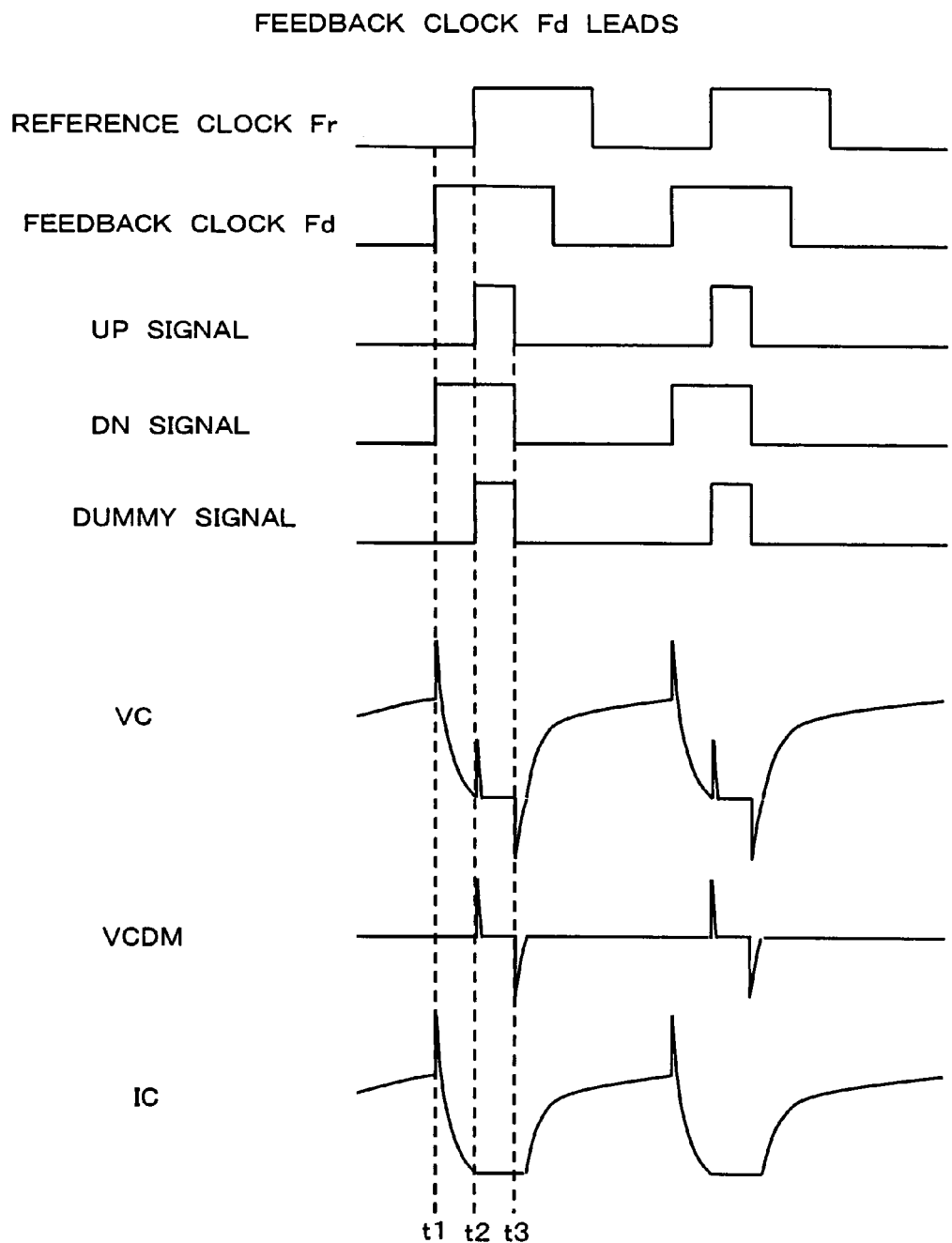
FIG. 3 shows a phase waveform and a voltage waveform of an internal element of the PLL circuit of the first embodiment.

Referring first to FIG. 3, description is given of the case where a phase of the feedback clock signal Fd leads a phase of the reference clock Fr. In this case, a rising edge of the DN1 signal appears earlier than that of the UP1 signal. At this time, when the DN1 signal is input to a gate of the NMOS transistor Tr2 of the first charge pump circuit 3 (t1 in FIG. 3), the NMOS transistor Tr2 is turned on. Then, a current In from the current source In flows from the first loop filter 4 to the ground potential. At this time, spiked noise is generated due to charger/discharge of the parasitic capacitance. Hence, the current Icn having the spiked noise superimposed thereon flows from the first loop filter 4 to the ground potential.

After that, when the UP1 signal is input to a gate of the PMOS transistor Tr1 (t2 in FIG. 3), the PMOS transistor Tr1 is also turned on. In this case, the PMOS transistor Tr1 and the NMOS transistor Tr2 are both turned on, so a current flows from the power supply potential to the ground potential. That is, during a period in which the UP1 signal and the DN1 signal both rise, no voltage is output to the first loop filter 4. However, even in this example, spiked noise is generated due to charge/discharge of the parasitic capacitance.

After that, if the UP1 signal and the DN1 signal fall at the same time (t3 in FIG. 3), the PMOS transistor Tr1 and the NMOS transistor Tr2 are both turned off. Thus, no current is output to the first loop filter 4. In this case as well, spiked noise is generated in accordance with a switching operation of the transistor.

As a result, a predetermined amount of current Icn corresponding to a phase difference (FIG. 3) between a phase level at the rising edge of the DN1 signal and that at the rising edge of the UP1 signal flows from the first loop filter 4 to the first charge pump circuit 3. Then, the first loop filter 4 outputs a voltage VC in accordance with the current output from the first charge pump circuit 3. Incidentally, spiked noise is superimposed on a current that flows into the first charge pump circuit 3 in accordance with a switching operation of the transistor. Along with this operation, spiked noise is superimposed on the voltage VC as well (VC in FIG. 3).

On the other hand, the AND circuit 5 generates dummy signals. In this embodiment, for example, a dummy signal synchronous with the UP signal is generated (in FIG. 3, dummy signal). The dummy signals output from the AND circuit 5 are input to the second charge pump circuit 6 as a dummy 1 signal and a dummy 2 signal. Incidentally, the dummy 1 signal and dummy 2 signal input to the second charge pump circuit 6 have the same pulse width.

The second charge pump circuit 6 operates in response to the input dummy 1 signal and dummy 2 signal. In this example, the dummy 1 signal and the dummy 2 signal have the same pulse width, so no current is output from the second charge pump circuit 6. However, the transistor is switched on/off in accordance with the dummy 1 signal and dummy 2 signal, so the parasitic capacitance is charged/discharged. Hence, spiked noise is output in accordance with a switching operation of the transistor. The spiked noise is output at timings t2 and t3. The timings are in sync with the rising edge and falling edge of the UP signal. That is, spiked noise synchronous with the rising edge and falling edge of the UP signal is output from the second charge pump circuit 6. At this time, the spiked noise is superimposed on the voltage VCDM output from the second loop filter 7 (in FIG. 3, VCDM).

The voltage-current converting circuit 8 receives the voltage VC output from the first loop filter 4 and the voltage VCDM output from the second loop filter 7 and then outputs a current corresponding to a differential voltage between the voltage VC and the voltage VCDM. As a result, the spiked noise superimposed on the voltage VC at the timings t2 and t3 is removed from a voltage input to the voltage-current converting circuit 8. Hence, as for a waveform of the current IC output from the voltage-current converting circuit 8, the spiked noise is only superimposed at the timing t1.

Figure 4:
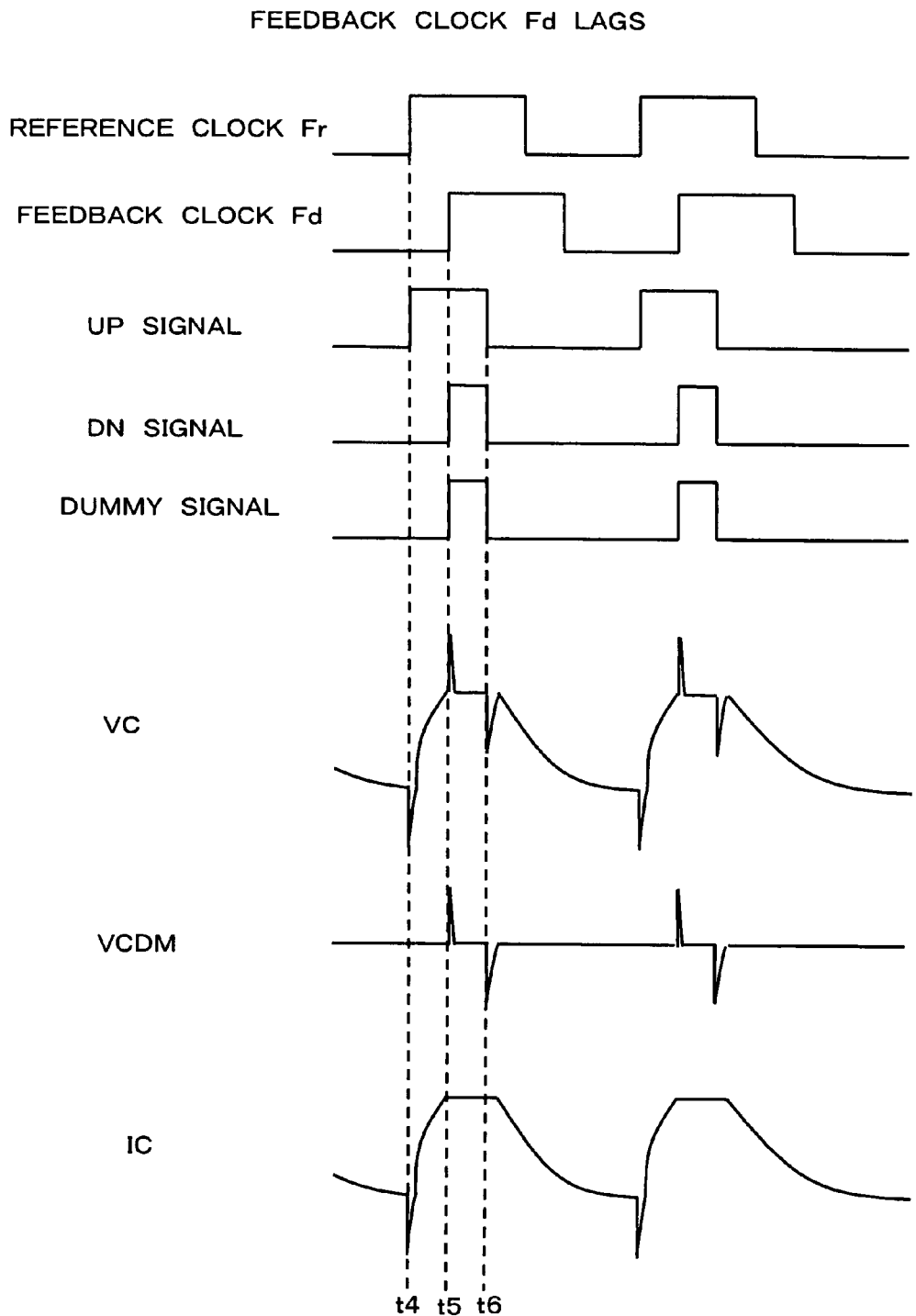
FIG. 4 shows a phase waveform and a voltage waveform of an internal element of the PLL circuit of the first embodiment.

Referring next to FIG. 4, description is made of the case where a phase of the feedback signal Fd leads a phase of the reference clock signal Fr. In this case, the UP1 signal rises earlier than the DN1 signal. At this time, if the UP1 signal is input to a gate of the PMOS transistor Tr1 of the first charge pump circuit 3 (in FIG. 4, t4), the PMOS transistor Tr1 is turned on. Here, the current Ip from the current source Ip flows out from the power supply potential to the loop filter 4. Further, spiked noise is generated due to charge/discharge of the parasitic capacitance. Thus, the current Icp having the spiked noise superimposed thereon is output to the loop filter 4.

After that, if the DN1 signal is input to the gate of the NMOS transistor Tr2 (in FIG. 4, t5), the NMOS transistor Tr2 is also turned on. In this case, the PMOS transistor Tr1 and the NMOS transistor Tr2 are both turned on, so a current flows from the power supply potential to the ground potential. That is, during a period in which the UP1 signal and DN1 signal rise at the same time, no voltage is output to the first loop filter 4. However, even in this example, spiked noise is generated due to charge/discharge of the parasitic capacitance.

After that, if the UP1 signal and DN1 signal fall at the same time (in FIG. 4, t6), the PMOS transistor Tr1 and the NMOS transistor Tr2 are both turned off. Hence, no current is output to the first loop filter 4. In this case as well, spiked noise is generated in accordance with a switching operation of the transistor.

Hence, a predetermined amount of current Icp corresponding to a phase difference (FIG. 4) between a phase level at the rising edge of the UP1 signal and that at the rising edge of the DN1 signal flows to the first loop filter 4. Then, the first loop filter 4 outputs a voltage VC in accordance with the current output from the first charge pump circuit 3. Incidentally, spiked noise is superimposed on a current that flows to the first loop filter 4 in accordance with a switching operation of the transistor. Along with this operation, spiked noise is superimposed on the voltage VC as well (VC in FIG. 4).

On the other hand, the AND circuit 5 generates dummy signals. In this embodiment, for example, a dummy signal synchronous with the DN signal is generated (in FIG. 4, dummy signal). The dummy signals output from the AND circuit 5 are input to the second charge pump circuit 6 as a dummy 1 signal and a dummy 2 signal. Incidentally, the dummy 1 signal and dummy 2 signal input to the second charge pump circuit 6 have the same pulse width.

The second charge pump circuit 6 operates in response to the input dummy 1 signal and dummy 2 signal. In this example, the dummy 1 signal and the dummy 2 signal have the same pulse width, so no current is output from the second charge pump circuit 6. However, the transistor is switched on/off in accordance with the dummy 1 signal and dummy 2 signal, so the parasitic capacitance is charged/discharged. Hence, spiked noise is output in accordance with a switching operation of the transistor. The spiked noise is output at timings t5 and t6. The timings are in sync with the rising edge and falling edge of the DN signal. That is, spiked noise synchronous with the rising edge and falling edge of the DN signal is output from the second charge pump circuit 6. At this time, the spiked noise is superimposed on the voltage VCDM output from the second loop filter 7 (in FIG. 4, VCDM).

The voltage-current converting circuit 8 receives the voltage VC output from the first loop filter 4 and the voltage VCDM output from the second loop filter 7 and then outputs a current corresponding to a differential voltage between the voltage VC and the voltage VCDM. As a result, the spiked noise superimposed on the voltage VC at the timings t5 and t6 is removed from a voltage input to the voltage-current converting circuit 8. Hence, as for a waveform of the current IC output from the voltage-current converting circuit 8, the spiked noise is only superimposed at the timing t4.

Figure 5:
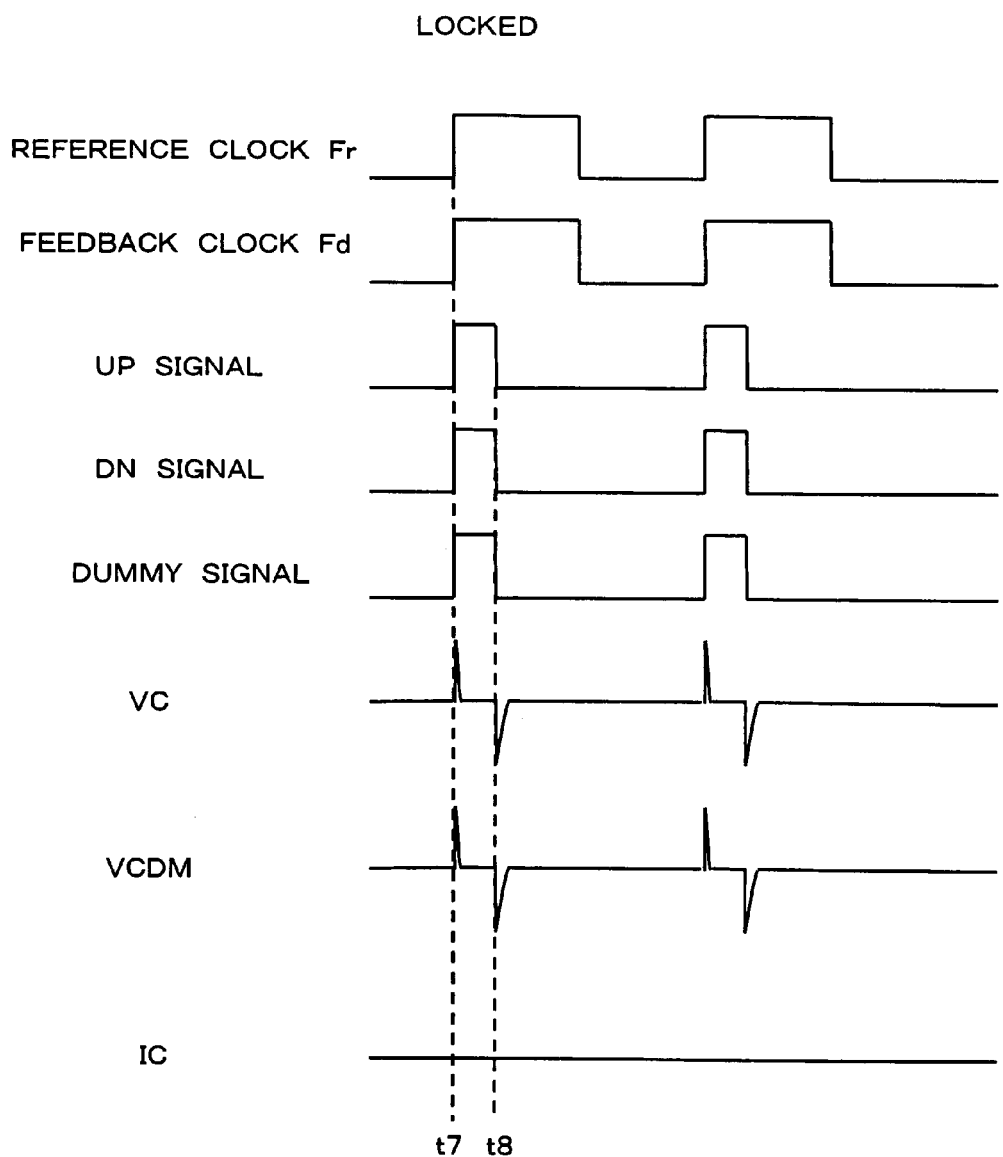
FIG. 5 shows a phase waveform and a voltage waveform of an internal element of the PLL circuit of the first embodiment.

Referring next to FIG. 5, description is given of the case where the reference clock signal Fr and the feedback clock signal Fd are in phase with each other. If the UP1 signal and the DN1 signal rise at the same time, the PMOS transistor Tr1 and the NMOS transistor Tr2 are both turned on (in FIG. 5, t7). In this case, a current flows from the power supply potential to the ground potential. After that, the UP1 signal and the DN1 signal fall at the same time, and transistor Tr1 and the transistor Tr2 are both turned off (in FIG. 5, t8). As described above, if the UP1 signal and the DN1 signal are in phase with each other, the UP1 signal and the DN1 signal have the same pulse width, so no current is output from the first charge pump circuit 3. However, the transistor is switched on/off in accordance with the UP1 signal and UP2 signal, so the parasitic capacitance is charged/discharged. Hence, spiked noise is output in accordance with a switching operation of the transistor. At this time, spiked noise is superimposed on the voltage VC output from the first loop filter 4 (in FIG. 5, VC).

On the other hand, the second charge pump circuit 6 operates in response to the input dummy 1 signal and dummy 2 signal. In this example, the dummy 1 signal and the dummy 2 signal have the same pulse width, so no current is output from the second charge pump circuit 6. However, the transistor is switched in response to the dummy 1 signal and dummy 2 signal, so the parasitic capacitance is charged/discharged. Hence, the spiked noise is output in accordance with a switching operation of the transistor. The spiked noise is output at timings t7 and t8. The timings are in sync with the rising edge and falling edge of the UP signal and DN signal. That is, the second charge pump circuit 6 outputs spiked noise synchronous with the rising edge and falling edge of the UP signal and DN signal. At this time, the spiked noise is superimposed on the voltage VCDM output from the second loop filter 7 (in FIG. 5, VCDM).

The voltage-current converting circuit 8 receives the voltage VC output from the first loop filter 4 and the voltage VCDM output from the second loop filter 7 and then outputs a current based on a differential voltage between the voltage VC and the voltage VCDM. As a result, the spiked noise superimposed on the voltage VC at the timings t7 and t8 is removed from a voltage input to the voltage-current converting circuit 8. Hence, as for a waveform of the current IC output from the voltage-current converting circuit 8, the spiked noise is not superimposed (in FIG. 5, IC). Then, the current-controlled oscillator 9 outputs an output clock signal Fout having a frequency corresponding to the current output from the voltage-current converting circuit 8.

As described above, the PLL circuit 100 generates the output voltage VCDM such that the first charge pump circuit 3 operating on the basis of the UP signal and the DN signal simulates spiked noise superimposed on the output voltage VC with the second charge pump circuit 6 operating on the basis of the dummy signal. Then, an oscillation frequency of the output clock signal output from the voltage-controlled oscillator 10 is controlled based on a differential voltage between the output voltage VC of the first charge pump circuit 3 and the output voltage VCDM of the second charge pump circuit 7. In this example, the PLL circuit 100 of this embodiment is configured such that the spiked noise superimposed on the output voltage VC and the spiked noise superimposed on the output voltage VCDM have substantially the same waveform. That is, there is no voltage difference of a noise waveform between the output voltage VC and the output voltage VCDM having substantially the same waveform. Hence, the output clock signal Fout generated with the voltage-controlled oscillator 10 is not influenced by the spiked noise, and no jitter occurs. Hence, according to the PLL circuit 100 of this embodiment, the output clock signal Fout including little jitter can be generated.

Second Embodiment

Figure 6:
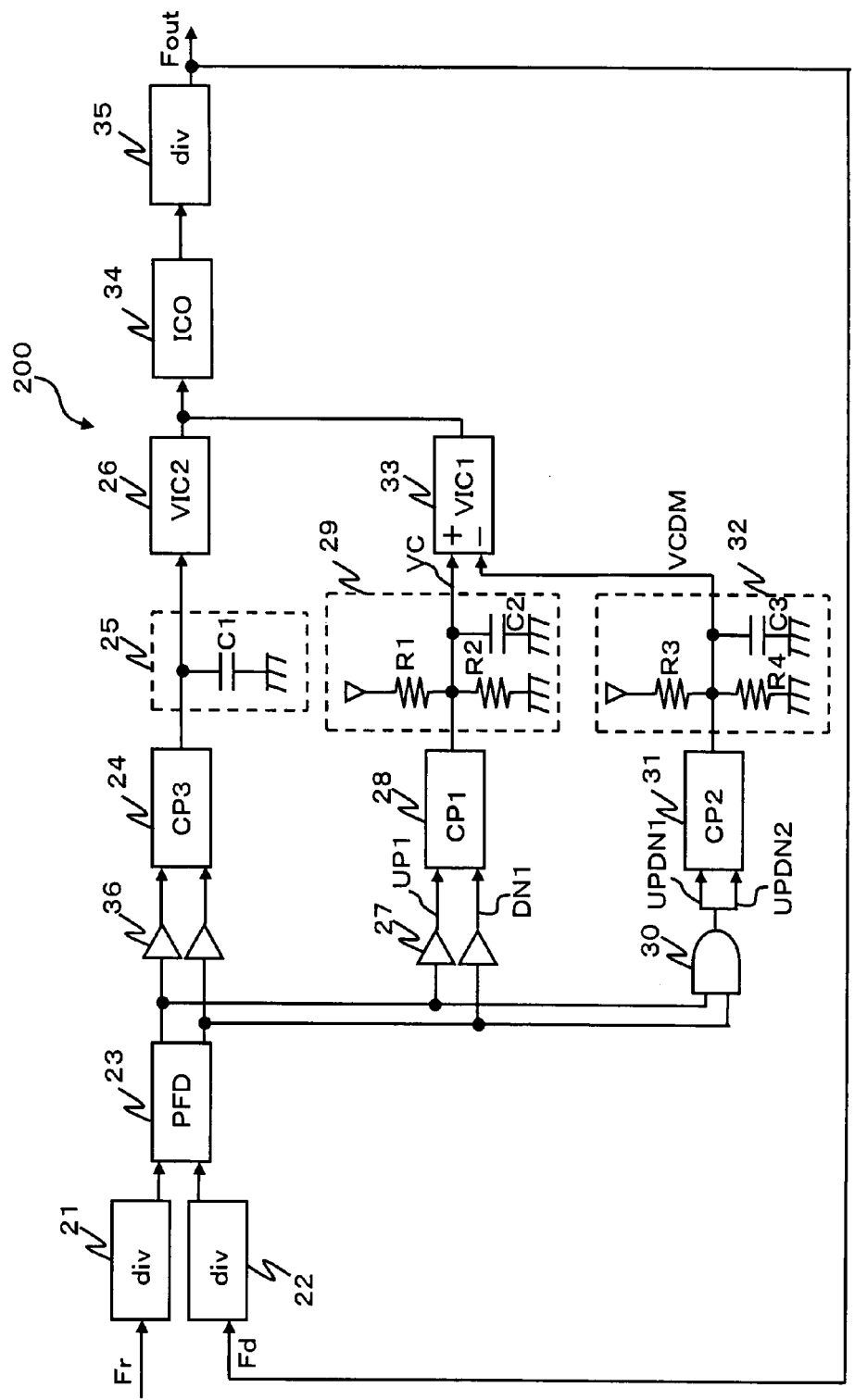
FIG. 6 shows a PLL circuit according to a second embodiment of the present invention.
Figure 7:
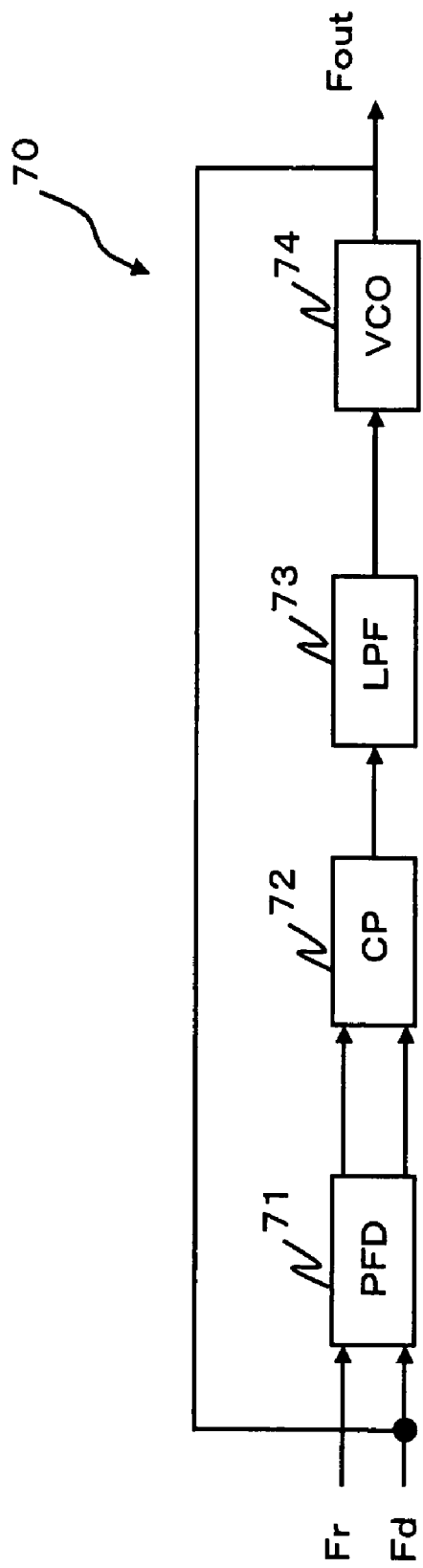
FIG. 7 shows a PLL circuit of the related art.
Figure 8:
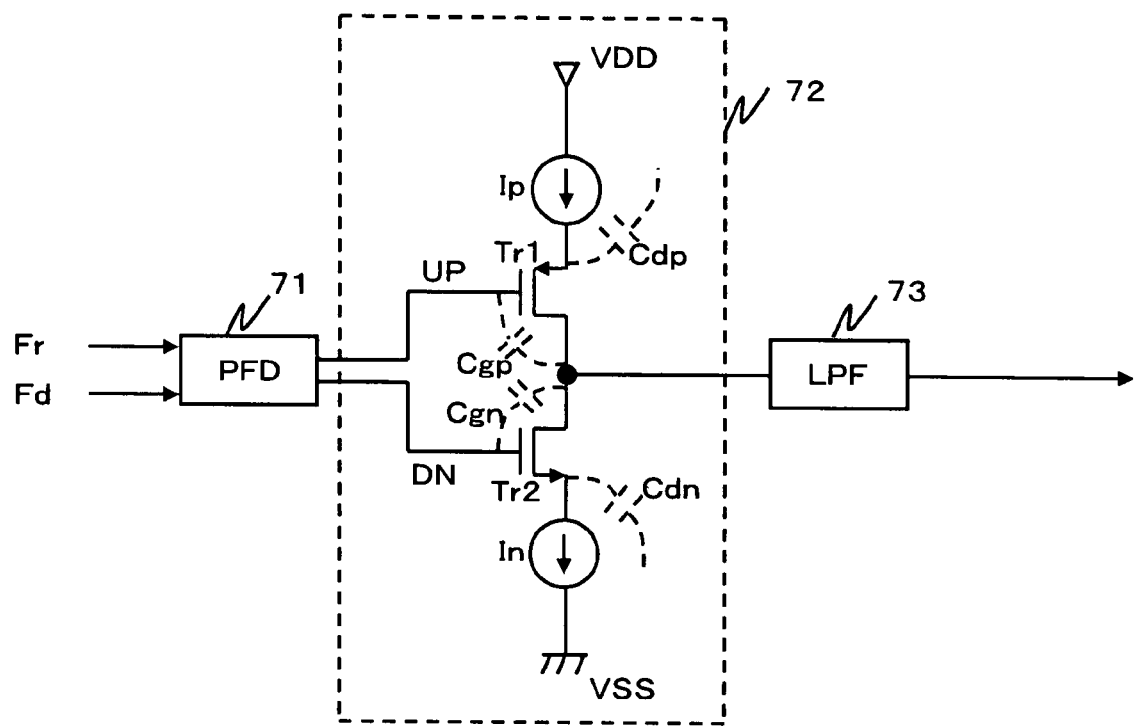
FIG. 8 shows a charge pump circuit in the PLL circuit of the related art.
Figure 9:
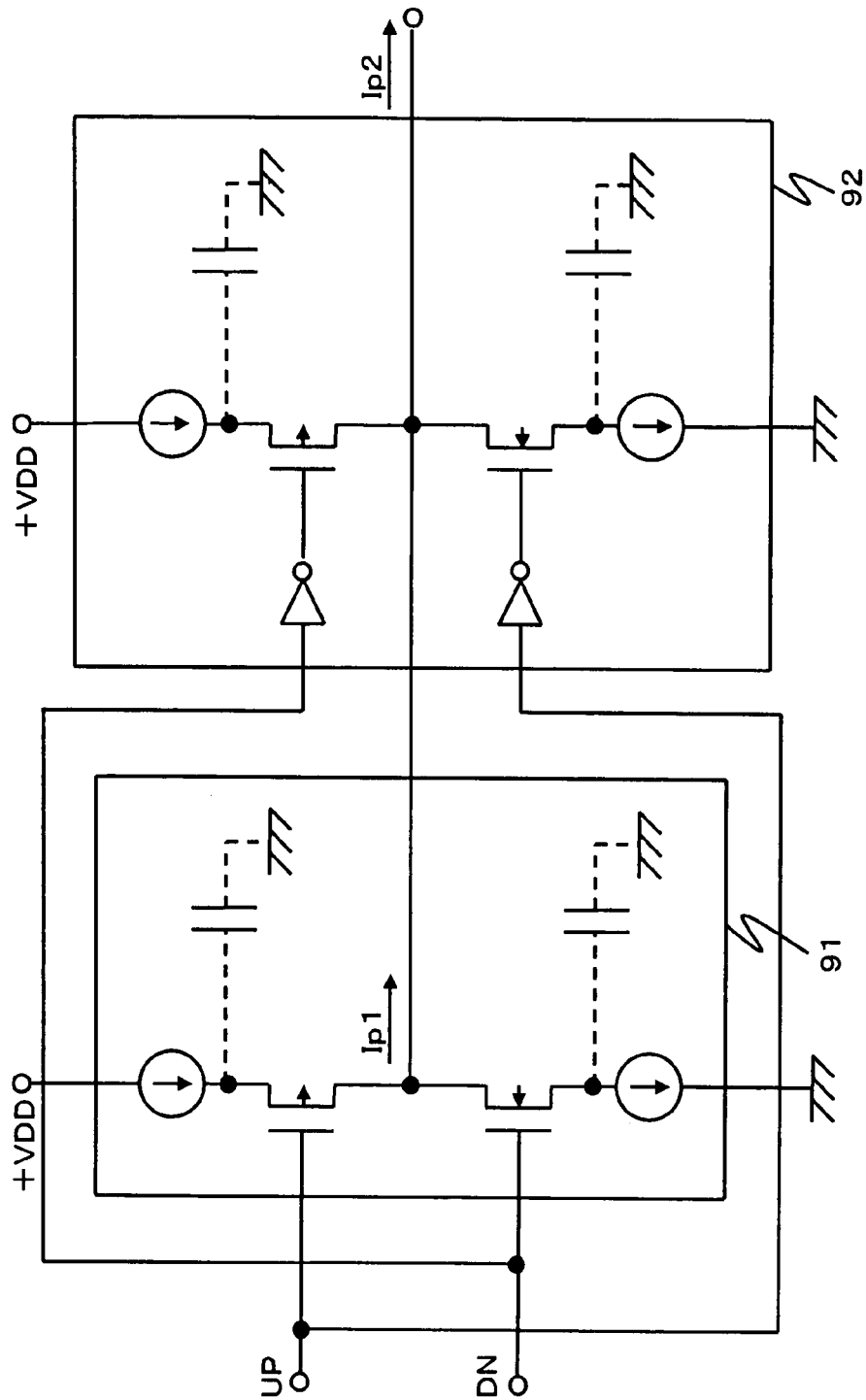
FIG. 9 shows a charge pump circuit in the PLL circuit of the related art.

FIG. 6 shows a PLL circuit 200 according to a second embodiment of the present invention. Referring to FIG. 6, the PLL circuit 200 is described below. The PLL circuit 200 aims at reducing a capacitance value of the capacitor as a component of the loop filter 4 of the PLL circuit 100 in the first embodiment. Hence, the PLL circuit 200 includes two pairs of the charge pump circuit 3 and the voltage-current converting circuit 8 of the first embodiment. In FIG. 6, one of the two pairs of the charge pump circuit and the voltage-current converting circuit includes a charge pump circuit 24 and a voltage-current converting circuit 26, and the other pair of the charge pump circuit and the voltage-current converting circuit includes a charge pump circuit 28 and a voltage-current converting circuit 33.

Further, the PLL circuit 200 includes an integrating filter 25 between one pair of the charge pump circuit and the current-voltage converting circuit, and a ripple filter 29 between the other pair of the charge pump circuit and the current-voltage converting circuit. Then, in the PLL circuit 200, an amount of output current from the charge pump circuit 24 is set smaller than that of the charge pump circuit 28. As a result, in the PLL circuit 200, while a capacitance value of the capacitor C1 as a component of the integrating filter 25 is reduced, a noise level determined by the product the capacitance value of the capacitor C1 and the output current of the charge pump circuit 24 is set substantially equal to a noise level at the PLL circuit 100.

However, in the PLL circuit 200, RF noise (for example, spiked noise) generated in the charge pump circuit 28 is not removed. This is because characteristics of the ripple filter 29 are optimized to remove jitter of the voltage generated in the charge pump circuit 28 (hereinafter referred to as "ripple noise") Hence, in the second embodiment, the configuration of the first embodiment is applied to the charge pump circuit 28 connected with the ripple filter 29. As a result, in the PLL circuit 200, spiked noise generated in the charge pump circuit 28 is reduced. The following description is directed to the pair including the charge pump circuit 28 and the configuration of the first embodiment that is applied to the pair.

In the second embodiment, the first charge pump circuit is the charge pump circuit 28, and the first filter is the ripple filter 29. On the other hand, the second charge pump circuit is the charge pump circuit 31, and the second filter is the ripple filter 32. Moreover, the dummy signal generating circuit is the AND circuit 30. Incidentally, in the second embodiment, as the charge pump circuits 28 and 31, the charge pump circuit having the same configuration as that of the first embodiment, for example, the charge pump circuit as shown in FIG. 2 is used.

The charge pump circuit 28 receives the UP1 signal and the DN1 signal from the phase frequency comparator 23 through the buffer circuit 27. Then, the charge pump circuit 28 controls an output current based on the UP1 signal and the DN1 signal. The ripple filter 29 outputs an output voltage VC based on an output current of the charge pump circuit 29.

The charge pump circuit 31 receives UPDN signals (UPND1 signal and UPDN2 signal in the drawings) generated with the AND circuit 30. The UPDN signals are generated with the AND circuit 30 based on the UP signal and DN signal output from the phase frequency comparator 23. Then, the charge pump circuit 31 controls an output current based on the UPDN1 signal and the UPDN2 signal. The ripple filter 32 sends out an output voltage VCDM in accordance with an output current of the charge pump circuit 31.

In this example, the ripple filter 29 and the ripple filter 32 have the same configuration. Thus, spiked noise caused by operations of the charge pump circuit and superimposed on the output voltage VC and spiked noise similarly generated and superimposed on the output voltage VCDM are at the same level. The voltage-current converting circuit 33 outputs an output current IC in accordance with a differential voltage between the output voltage VC and the output voltage VCDM. Hence, noise resulting from the spiked noise is not superimposed on the output current IC.

Then, the output current IC and an output current from the current-voltage converting circuit 26 are added, and a frequency of the output clock signal Fout is controlled by the current-controlled oscillator 34 based on the added current. As a result, jitter of the output clock signal Fout is reduced.

As described above, in the PLL circuit 200 of the second embodiment, the configuration of the first embodiment is applied to the ripple filter having a small ability to reduce the spiked noise. As a result, it is possible to reduce the spiked noise generated with the charge pump circuit connected with the ripple filter. That is, in the PLL circuit 200 as well, a frequency of the output clock signal Fout can be controlled based on the output current IC not influenced by the spiked noise. Further, the PLL circuit 200 can reduce jitter of the output clock signal Fout. Moreover, if the present invention is applied to a portion having a small ability to reduce the spiked noise as in the PLL circuit 200, an effect of reducing noise is enhanced.

It is apparent that the present invention is not limited to the above embodiment, but may be modified and changed without departing from the scope and spirit of the invention.

What is claimed is:

1. A Phase Locked Loop (PLL) circuit, comprising:
a phase comparing circuit comparing a phase of a reference clock signal with a phase of a feedback clock signal to output a voltage-up signal and a voltage-down signal based on a phase difference between the reference clock signal and the feedback clock signal;
a first charge pump circuit generating a first current based on the voltage-up signal and the voltage-down signal;
a dummy signal generating circuit outputting a dummy signal having substantially a same pulse width as a pulse width of one of the voltage-up signal and the voltage-down signal in sync with the voltage-up signal or the voltage-down signal;
a second charge pump circuit generating a second current based on the dummy signal; and
a voltage-controlled oscillator controlling an output clock frequency based on a differential voltage between a first voltage generated in accordance with the first current and a second voltage generated in accordance with the second current.

2. The PLL circuit according to claim 1, wherein the dummy signal generating circuit generates the dummy signal based on a logical product or a logical addition of the voltage-up signal and the voltage-down signal.

3. The PLL circuit according to claim 1, wherein the first voltage is generated by a first filter, and the second voltage is generated by a second filter.

4. The PLL circuit according to claim 3, wherein the first charge pump circuit and the second charge pump circuit have substantially a same circuit configuration, and
the first and second filters have substantially a same circuit configuration.

5. The PLL circuit according to claim 1, wherein the voltage-controlled oscillator comprises:
a voltage-current converting circuit outputting a current based on a differential voltage between the first voltage and the second voltage; and
a current-controlled oscillator controlling an output clock based on the current.

6. The PLL circuit according to claim 1, wherein a buffer to adjust a delay difference between the dummy signal and the voltage-up signal or the voltage-down signal is connected between the phase comparing circuit and the first charge pump circuit.

7. A phase locked loop (PLL) circuit, comprising:
- a first charge pump circuit generating a first current based on a voltage-up signal and a voltage-down signal resultant from a phase comparison of a reference input clock signal and a clock signal output from said PLL;
- a second charge pump circuit generating a second current based on the voltage-up signal and the voltage-down signal; and
- a voltage-controlled oscillator controlling said output clock signal based on a differential voltage between a first voltage generated in accordance with the first current and a second voltage generated in accordance with the second current; wherein the voltage-up signal and the voltage-down signal received by said second charge pump circuit comprises a dummy signal having substantially a same pulse width as a pulse width of one of the voltage-up signal and voltage-down signal in sync with the voltage-up signal or the voltage-down signal, thereby said differential voltage as input into said voltage controlled oscillator provides a cancellation of transients as an input signal into said voltage controlled oscillator.

8. The PLL circuit of claim 7, further comprising a phase comparing circuit receiving a reference clock signal and comparing a phase of said reference clock signal with a phase of said output clock frequency of said voltage-controlled oscillator, wherein the voltage-up signal and the voltage-down signal are output from said phase comparing circuit.

9. The PLL circuit of claim 7, wherein said dummy signal comprises one of a logical product and a logical addition of the voltage-up signal and the voltage-down signal.

10. A method of reducing a jitter in a phase locked loop (PLL) circuit comprising a first charge pump circuit that provides a current to control an oscillator to provide an output clock frequency of said PLL circuit, said output clock frequency used as feedback in said PLL circuit for comparison with a reference clock signal received as an input of said PLL circuit, said first charge pump circuit controlled by a voltage-up signal and a voltage-down signal resultant from the comparison of said reference clock signal and said output clock signal, said method comprising:
- controlling a second charge pump based on said voltage-up signal and said voltage-down signal; and
- providing said oscillator with a differential voltage of voltages resultant from said first charge pump circuit and said second charge pump circuit; wherein the voltage-up signal and the voltage-down signal received by said second charge pump circuit comprises a dummy signal having substantially a same pulse width as a pulse width of one of the voltage-up signal and the voltage-down signal in sync with the voltage-up signal or the voltage-down signal, thereby said differential voltage as input into said oscillator provides a cancellation of transients as an input signal into said oscillator.

11. The method of claim 10, wherein the voltage-up signal and the voltage-down signal are output from a phase comparing circuit receiving a reference clock signal and comparing a phase of said reference clock signal with a phase of said output clock frequency of said oscillator.

12. The method of claim 10, wherein said dummy signal comprises one of a logical product and a logical addition of the voltage-up signal and the voltage-down signal.

* * * * *